United States Patent [19]

Dingwall et al.

[11] Patent Number: 5,036,219
[45] Date of Patent: Jul. 30, 1991

[54] PRECISE, HIGH SPEED CMOS TRACK (SAMPLE)/HOLD CIRCUITS

[75] Inventors: Andrew G. F. Dingwall, Princeton; Victor Zazzu, Belle Mead; Harry G. Erhardt, Lawrenceville, all of N.J.

[73] Assignee: Harris Corporation, Melbourne, Fla.

[21] Appl. No.: 359,176

[22] Filed: May 31, 1989

[51] Int. Cl.$^5$ .............................. G11C 27/02
[52] U.S. Cl. ............................ 307/353; 307/257
[58] Field of Search ............ 307/321, 353, 352, 257, 307/317.2, 572

[56] References Cited

U.S. PATENT DOCUMENTS

| | | | |
|---|---|---|---|
| 3,597,633 | 8/1971 | Hirano et al. | 307/257 |
| 3,721,829 | 3/1973 | Benson | 307/352 |
| 3,840,754 | 10/1974 | Okada et al. | 307/257 |
| 3,973,142 | 8/1976 | Hill | 307/257 |
| 4,518,921 | 5/1985 | Logan | 307/353 |
| 4,728,819 | 3/1988 | Vu | 307/353 |

Primary Examiner—John Zazworsky
Attorney, Agent, or Firm—Henry I. Schanzer

[57] ABSTRACT

A precise, high speed CMOS track (sample)/hold circuit uses a first circuit leg including four Schottky barrier diodes configured to form a Wheatstone bridge, a second leg with a single n-channel MOS transistor, an essentially constant current source having MOS transistors, a capacitor for holding output signal, and reverse biasing circuitry having MOS transistors for selectively reverse biasing the four diodes. An analog input signal is applied to the cathode of the first diode and to the anode of the second diode. An output signal of the same magnitude and polarity as the input signal is generated at an output terminal (the cathode of the third diode and the anode of the fourth diode) of the circuit when current flows through the first circuit leg. When the current flowing through the first circuit leg is switched to the second circuit leg, the capacitor, which is connected to an output terminal of the circuitry, holds the generated output signal level and the reverse biasing circuitry reverse biases all of the diodes so as to isolate the capacitor from all other components of the circuit.

29 Claims, 5 Drawing Sheets

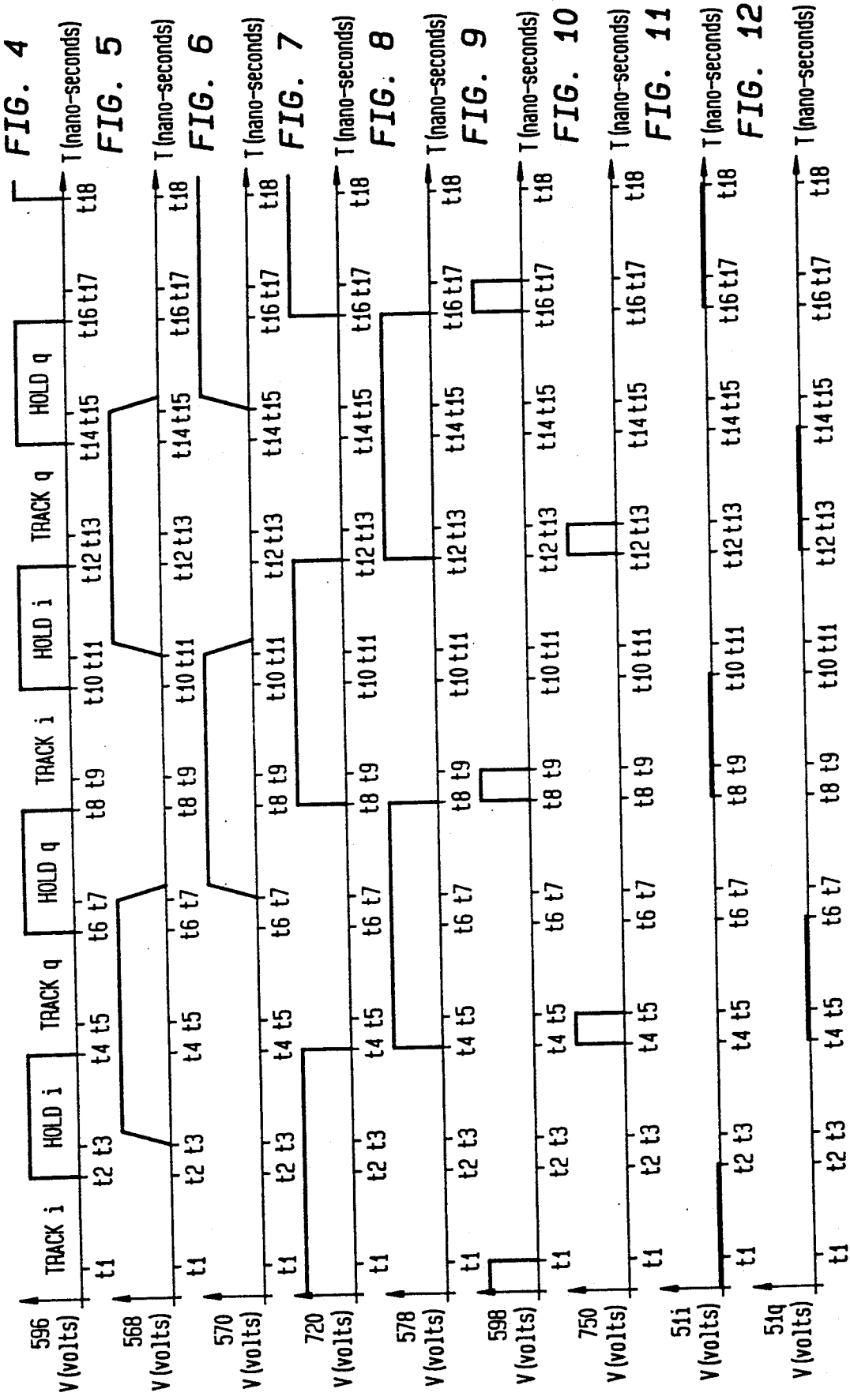

PRECISE, HIGH SPEED CMOS TRACK (SAMPLE)/HOLD CIRCUITS

FIELD OF THE INVENTION

This invention relates to semiconductor circuitry and particularly to high speed track (sample)/hold circuitry useful in radar and video applications.

BACKGROUND OF THE INVENTION

A track/hold circuit is an important component of a high speed Analog-to-Digital Converter (ADC) which requires high speed accurate sampling of an analog signal. Typically to achieve 12 bit accuracy, the aperture jitter must be less than 0.01 nanoseconds for a 10 MHz signal sampled to an accuracy less than 1 millivolt. For a 10 bit video signal, the aperture jitter must be less than 0.06 nanoseconds. It is difficult to achieve such timing accuracy independent of the voltage level of the input signal which can vary in amplitude a few volts using the well know CMOS transmission gate (the parallel combination of an n-channel and a p-channel MOS transistor) as a sampling element. This transmission gate is not well suited for precise timing accuracy since the rise and fall time of the clock signals used to control same are typically in the order of 0.5 to 1.5 nanoseconds and their gradual shutoff characteristic could easily result in wide variation of the effective sampling time period as the input signal varies over the full scale range.

The fastest known commercially available track/hold circuits are hybrid-bipolar combinations which can not be commercially formed on a CMOS integrated circuit chip. In addition, these combinations are not as fast as may be required in very fast ADC's.

It is desirable to have a high speed ADC which uses only CMOS compatible components that can be fabricated on a Silicon-On-Sapphire (SOS) integrated circuit chip or on a conventional integrated circuit chip.

SUMMARY OF THE INVENTION

The present invention is directed to track/hold circuitry which is capable of high speed and high accuracy operation. The track/hold circuitry can be fabricated using CMOS technology on a conventional integrated circuit chip or on a SOS integrated circuit chip. In one embodiment the circuitry comprises a circuit leg comprising first, second, third and fourth diodes configured as a Wheatstone bridge with a circuit input terminal coupled to the cathode of the first diode and to the anode of the second diode and with a circuitry output terminal coupled to the cathode of the first diode and to the anode of the fourth diode. The circuitry further comprises a current source coupled to the circuit leg, storage means coupled to the circuitry output terminal and control means coupled to the diodes for controlling current flow through the diodes such that selectively current can be diverted away from the diodes. The anodes of the first and third diodes are coupled together and the cathodes of the second and fourth diodes are coupled together.

In another embodiment the circuitry comprises first and second circuit legs with a current source coupled thereto, storage means coupled to a circuitry output terminal and control means for controlling current flow through the first and second circuit legs such that current can flow through one circuit leg or the other. The first circuit leg comprises first, second, third and fourth diodes configured as a Wheatstone bridge with a circuit input terminal coupled to the cathode of the first diode and to the anode of the second diode and with the output terminal coupled to the cathode of the first diode and to the anode of the fourth diode. The anodes of the first and third diodes are coupled together and the cathodes of the second and fourth diodes are coupled together.

In a preferred embodiment the diodes are Schottky barrier diodes, the second circuit leg comprises a Metal-Oxide-Semiconductor (MOS) transistor and the current source is an essentially constant current source.

The circuitry of the present invention can be used in at least two different modes. In a first mode of operation an analog signal is applied to the circuitry input terminal with current allowed to flow through the second circuit leg and the four diodes thereof. The signal appearing at the circuitry output terminal is set to a potential level equal to that of the input signal level and then the current flow through the second circuit leg is diverted to the first circuit leg and the diodes are reverse biased. This isolates the capacitor from the rest of the circuitry and it continues to float in potential at the previously set level. Another sample of the input signal, which is typically different from the first sample, can be taken and transferred to the circuitry output terminal by eliminating the reverse biasing of the diodes and diverting the current of the current source back through the second circuit leg and the diodes.

In a second mode of operation a reference potential, e.g., ground potential, is applied to the circuitry input terminal and maintained there. When current passes through the second circuit leg and the four diodes, the potential of the capacitor is set to ground potential. When the current is diverted to the second circuit leg and the diodes are reverse biased, the capacitor floats at ground level and the second terminal thereof can have different potentials applied thereto. The circuitry acts as a ground break switch in this application.

The invention will be better understood from the following more detailed description taken with the accompanying drawing and claims.

BRIEF DESCRIPTION OF THE DRAWING

FIGS. 4, 5, 6, 7, 8, 9, 10, 11 and 12 graphically show voltage waveforms versus time which are applied to and/or generated by the circuitry of FIG. 3.

DETAILED DESCRIPTION

Figure 1:
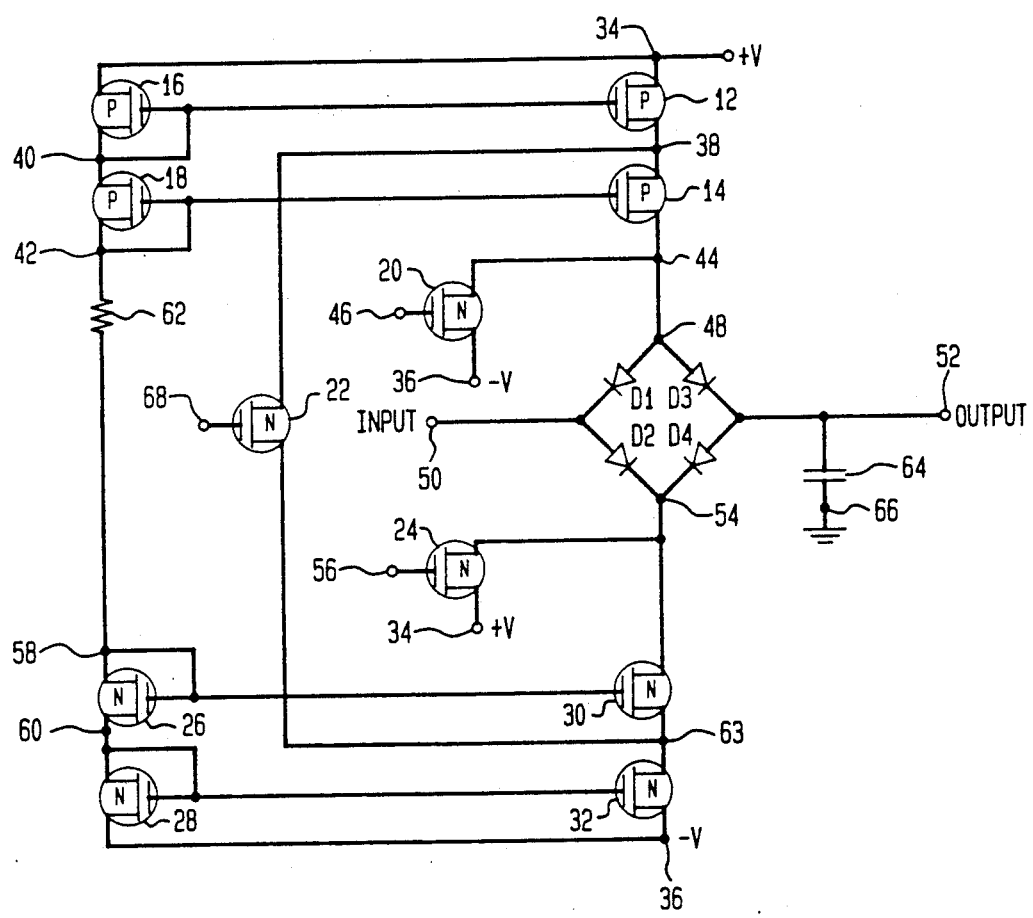
FIG. 1 shows a track (sample)/hold circuit in accordance with an embodiment of the invention.

Referring now to FIG. 1, there is shown a track (sample)/hold circuit 10 in accordance with an embodiment of the present invention. Circuit 10 comprises p-channel transistors 12, 14, 16 and 18, n-channel transistors 20, 22, 24, 26, 28, 30, and 32, diodes D1, D2, D3, and D4, a resistor 62 and a capacitor 64. An input terminal 50 is coupled to the anode of D1 and to the cathode of D2. An output terminal 52 is coupled to the cathode of D3, to the anode of D4 and to a first terminal of capacitor 64. Circuit 10 acts to accurately and rapidly sample the voltage level of an input signal applied to input terminal 50 and to generate on output terminal 52 an output signal which has the same magnitude and polarity as the applied input signal and which is held as the voltage of capacitor 64.

Transistors 14 and 30, diodes D1, D2, D3 and D4 and capacitor 64 form a first circuit leg of circuit 10. Transistor 68 forms a second circuit leg of circuit 10. Transistors 12 and 32 form an essentially constant current source which generates an essentially constant current which is switched between the legs of the circuit 10. Transistors 16, 18, 26 and 28 and resistor 62 form a biasing circuit which biases on (enables) transistors 14 and 30 of the first circuit leg and transistors 12 and 32 of the essentially constant current source by generating appropriate voltage levels at terminals 40, 42, 56 and 60. Transistors 20 and 24 serve as reverse biasing circuitry (means) which selectively causes D1, D2, D3, and D4 to be reverse biased so as to facilitate a cut off of current flow through the second circuit leg and to electrically isolate output terminal 52 from the rest of circuit 10 except for capacitor 64.

A first positive voltage source +V is coupled to the sources of transistors 12 and 16, to the drain of transistor 24 and to a terminal 34. A second negative voltage source −V is coupled to the sources of transistors 20, 28 and 32 to a terminal 36. A second terminal of capacitor 64 is coupled to a terminal 66 and to reference potential (shown as ground potential). The reference potential is typically selected to be essentially midway in voltage between voltage sources +V and −V.

It is assumed in an n-channel transistor that positive current flow occurs form on output terminal denoted as the drain to other output terminal denoted as the source. It is assumed in a p-channel transistor that positive current flow occurs form one output terminal denoted the source to another output terminal denoted the drain. If the direction of current flow through a transistor reverses, the designation of the output terminals as a drain or source reverses.

The gate of transistor 12 is coupled to the gate and drain of transistor 16, to the source of transistor 18 and to a terminal 40. The drains of transistors 12 and 22 are coupled to the source of transistor 14 and to a terminal 38. The gate of transistor 14 is coupled to the gate and drain of transistor 18, to a first terminal of resistor 62 and to a terminal 42. The drains of transistors 14 and 20 are coupled to the anodes of diodes D1 and D3 and to a terminal 48. The gate of transistor 20 is coupled to a terminal 46. The cathodes of diodes D2 and D4 are coupled to the drain of transistor 30, to the source of transistor 24 and to a terminal 54. The gate of transistor 30 is coupled to the gate and drain of transistor 26 and to a terminal 58. The sources of transistors 22 and 30 are coupled to the drain of transistor 32 and to a terminal 63. The gate and drain of transistor 28 and the gate of transistor 32 are coupled to a terminal 60.

Diodes D1, D2, D3 and D4, which in a preferred embodiment are Schottky barrier diodes, are configured as a Wheatstone bridge. D1, D2, D3, and D4 are essentially identical in electrical characteristics.

The operation of circuit 10 is as follows: Assume that control signals applied to the gates (terminals 46, 68, and 56) of transistors 20, 22 and 24 are at low levels, "0's". This biases off (disables) transistors 20, 22 and 24. This condition results in a flow of current from +V through the first leg of circuit 10 and to −V. Current flow through transistor 12 and 14 splits and flows through D1 and D2 and through D3 and D4 and then recombines to flow through transistors 30 and 32.

An input signal having a potential level in a useful range between +V and −V less operating voltage drops across transistors 12, 14, 30 and 32 is applied to input terminal 50. The Wheatston bridge comprising diodes D1, D2, D3 and D4 acts to automatically adjust current flow through D1 and D3 and through D2 and D4 such that the potential of output terminal 52 closely follows the potential applied to input terminal 50. This is easily seen in that the potential of terminal 48 is one diode (D1) drop above that of input terminal 50. Since output terminal 50 is also one diode (D3) drop below terminal 48 and the voltage drop across D1 equals the voltage drop across D3 when equal currents flow through both, the voltage of output terminal 52 is equal to that of input terminal 50. Soon after output terminal 52 is set to the same voltage as input terminal 50, transistors 20, 22 and 24 are enabled (biased on) by applying high levels of "1's" to gate terminals 46, 50, and 56. This enables (biases on) transistors 20, 22, and 24 which in turn reverse biases D1, D2, D3 and D4 and facilitates current flow through transistor 22. Accordingly, current flow ceases through the first leg of circuit 10 and begins through the second leg of circuit 10 which comprises transistor 22. The potential of terminals 38 and 63, across which the switching transistor is held, is essentially equal to the fixed bias potentials of terminals 40 and 60, respectively, regardless of the potentials that terminals 48 and 54 assume as they track the input voltage. Thus the switching performance of transistor. 22 is essentially independent of the input voltage applied to input terminal 50. Since current through D1, D2, D3, and D4 is cutoff and they are all reverse biased, output terminal 52 is left floating in potential at the previous value of an input signal applied to input terminal 50. The potential level of the voltage on output terminal 52 is held by capacitor 64. Now the input signal level applied to input terminal 50 can change and then transistors 20, 22 and 24 can again be disabled. The output signal at output terminal 52 then assumes the same potential level and polarity as the second input signal applied to input terminal 50.

Circuit 10 is particularly useful as a track (hold)/sample circuit of an Analog-to-Digital Converter (ADC) wherein the input signal to input terminal 50 is an analog signal. Circuit 10 is used to rapidly take continuous samples of the analog input signal and to accurately reproduce same at output terminal 52. Schottky barrier diodes have essentially no minority carrier storage and operate in a forward bias condition with just a few (e.g., typically 200 to 400) hundred millivolts. This makes it possible to rapidly turn on and off diodes D1, D2, D3 and D4 and thus facilitates a high rate of sampling of an input analog signal applied to input terminal 50.

Figure 2:
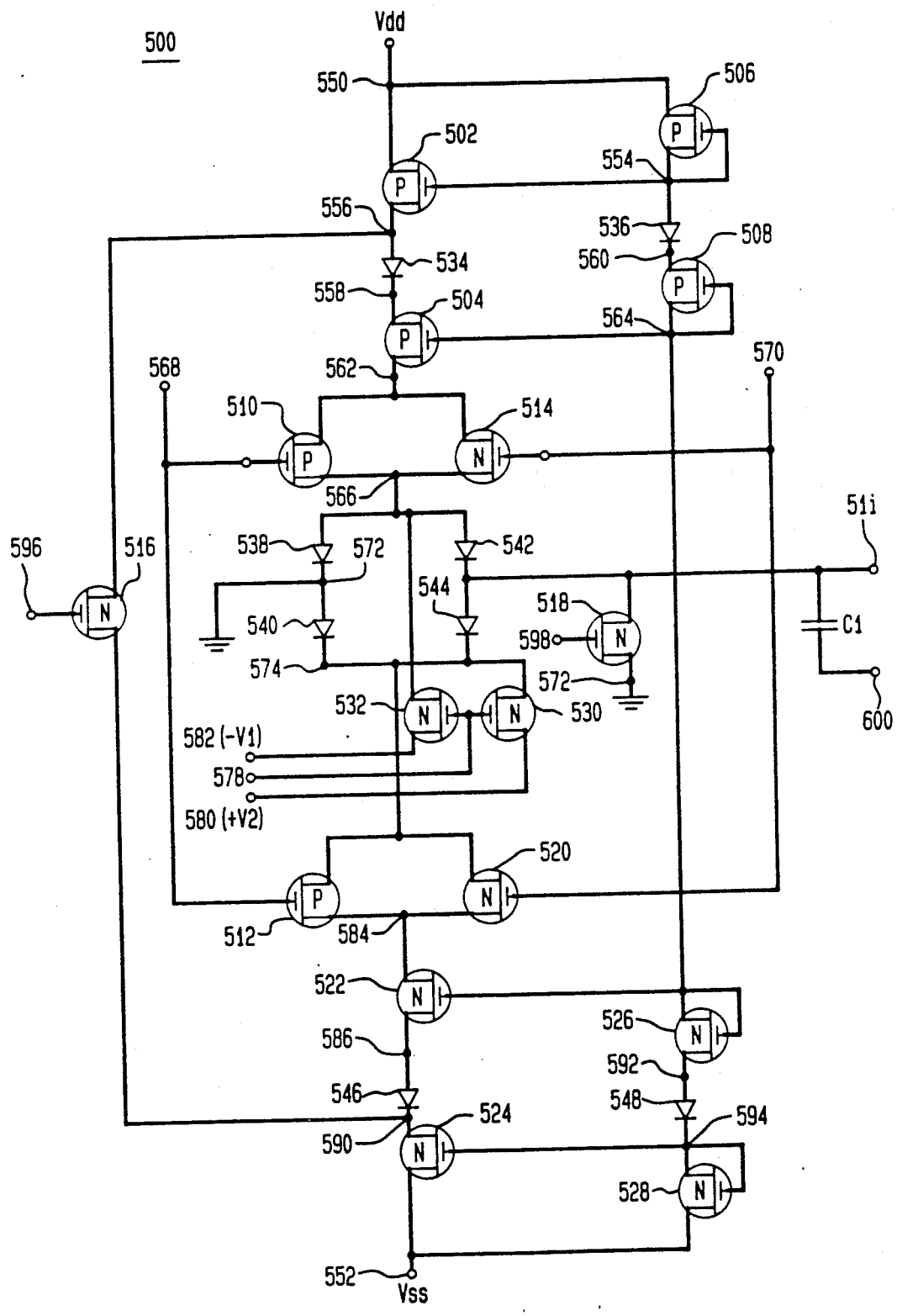
FIG. 2 shows ground break circuitry in accordance with another embodiment of the invention.

Referring now to FIG. 2, there is shown switching circuitry 500 in accordance with another embodiment of the invention. Switching circuitry 500 is designed to selectively set an output terminal 51i thereof to ground potential and then to allow it to electrically float in potential. Switching circuitry 500 comprises p-channel MOS transistors 502, 504, 506, 508, 510 and 512, n-channel MOS transistors 514, 516, 518, 520, 522, 524, 526, 528, 530 and 532, diodes 534, 536, 538, 540, 542, 544, 546, and 548 and a capacitor C1. In a preferred embodiment all of the diodes are Schottky barrier diodes.

The sources of transistors 502 and 506 are coupled to a terminal 550 and to a positive voltage source Vdd. The sources of transistors 524 and 528 are coupled together to a terminal 552 and to a negative voltage source Vss. An input terminal 572, which is coupled to a ground potential, is also coupled to the cathode of diode 538 and to the anode of diode 540. The source of transistor 532 is coupled to a terminal 582 which is coupled to a negative voltage source −V1. The source of transistor 530 is coupled to a terminal 580 which is coupled to a positive voltage source +V2. The cathode of diode 542 is coupled to the anode of diode 544, to the drain of transistor 518, to a first terminal of the capacitor C1 and to the circuitry output terminal 51i. A second terminal of capacitor C1 is coupled to a terminal 600 to which signals or voltage levels can be applied.

The drain of transistor 502 is coupled to the anode of diode 534, to the drain of transistor 516 and to a terminal 556. The gate and the drain of transistor 506 are coupled to the gate of transistor 502, to the anode of diode 536 and to a terminal 554. The cathode of diode 534 is coupled to the source of transistor 504 and to a terminal 558. The cathode of diode 536 is coupled to the source of transistor 508 and to a terminal 560. The gate and drain of transistor 508 are coupled to the gate of transistor 504, to the gate and drain of transistor 526, to the gate of transistor 522 and to a terminal 564. The source of transistor 504 is coupled to the source of transistor 510, to the drain of transistor 514 and to a terminal 562. The drains of transistors 510 and 532 are coupled to the source of transistor 514, to the anode of diodes 538 and 542 and to a terminal 566. The gates of transistors 510 and 512 are coupled to a terminal 568. The gates of transistors 514 and 520 are coupled to a terminal 570. The source of transistor 516 is coupled to the cathode of diode 546, to the drain of transistor 524 and to a terminal 590. The gate of transistor 516 is coupled to a terminal 596. The cathodes of diodes 540 and 544 are coupled to the drains of transistors 520 and 530, to the source of transistor 512 and to a terminal 574. The gate of transistor 518 is coupled to a terminal 598. The source of transistor 518 is coupled to a terminal 572 and to a reference potential which is shown as ground. A second terminal of capacitor C1 is coupled to a terminal 600. The gates of transistors 530 and 532 are coupled to a terminal 578. The drains of transistors 512 and 522 are coupled to the source of transistor 520 and a terminal 584. The source of transistor 522 is coupled to the anode of diode 546 and to a terminal 586. The source of transistor 526 is coupled to the anode of diode 548 and to a terminal 592. The cathode of diode 548 is coupled to the gate and drain of transistor 528, to the gate of transistor 524 and to a terminal 594.

The serial combination of transistors 506, 508, 526 and 528 and diodes 536 and 548 serves to generate voltages at the gates of transistors 502 and 524 that insure that an essentially constant current flows through transistors 502 and 524. This current can be selectively switched through a first circuit leg comprising diode 534, transistors 504, 510, 512, 514, 520 and 522 and diodes 534, 538, 540, 542, 544 and 546 or can flow through a second circuit leg which comprises transistor 516.

Assuming first that transistor 516 is biased on by an appropriate potential applied to the gate (terminal 596) thereof and transistors 510, 512, 514 and 520 are biased off by appropriate voltage levels applied to the gates (terminal 568 for transistors 510 and 512, terminal 570 for transistors 514 and 520) thereof. Transistors 530 and 532 are both biased (turned) on (enabled) and thus potentials −V1 and +V2, which are coupled to terminals 582 and 580, respectively, pass through turned-on transistors 532 and 530, respectively, and appear on terminals 566 and 574, respectively. This reverse biases diodes 538, 540, 542 and 544. Transistor 518 is biased off at this time by an appropriate potential applied to the gate (terminal 598) thereof. Thus output terminal 51i is isolated from all other components of switching circuitry 500 and electrically floats in potential. A voltage level or signal (both not shown) applied to terminal 600 while terminal 51i is floating in potential affects the potential level of terminal 51i.

When it is desired to actively hold output terminal 51i at ground potential, transistors 516, 530 and 532 are biased off and transistors 510, 512, 514, 520 and 518 are biased on. This causes current flow through the second circuit leg (transistor 516) to be cut off and switches the current flow to the first circuit leg where it divides equally between the series combination of diodes 538 and 540 and the series combination of diodes 542 and 544. The turning on of transistor 518 causes terminal 51i to rapidly be set to ground potential. After a short time period (e.g., typically about 10 nanoseconds) transistor 518 is turned off and the potential of output terminal 51i is typically close to ground potential but not close enough in some applications due to transient effects. To insure that terminal 51i is set to ground potential, current flow through the first circuit leg is maintained until terminal 51i is at ground potential and then it is cut off by turning off transistors 510, 512, 514 and 520 and turning on transistors 530 and 532.

Diodes 538 and 540 form one leg of a Wheatstone bridge and diodes 542 and 544 form the other leg of the Wheatstone bridge. With diode 538 being matched to diode 542 and diode 540 being matched to diode 544, and with equal current flow through both series combinations of diodes, the potential level, in this case ground potential, applied to terminal 572, appears at output terminal 51i. Accordingly, with current flow through diodes 538, 540, 542 and 544, the potential of output terminal 51i is set to and held at ground. Current flow through diodes 538, 540, 542 and 544 is continued after transistor 518 is biased off such that a true ground signal exists on output terminal 51i before current flowing through the diodes 538, 540, 542 and 544 is cut off and diodes 538, 540, 542 and 544 are reversed biased. This essentially and rapidly electrically isolates capacitor C1 from the rest of circuitry 500. In some applications transistors 510, 512, 514 and 520 can be eliminated since the turning on of transistor 516 and the reverse biasing of diodes 538, 540, 542 and 544 both cut off current through the first circuit leg. Diodes 534 and 546 help limit leakage from the first circuit leg to terminals 556 and 590, respectively.

Circuitry 500 is particularly useful as part of a analog-to-digital converter (ADC) (not shown) wherein an input analog signal (not shown) is applied to terminal 600 of capacitor C1 when terminal 51i is set to ground potential and held there, and an output voltage from a comparator (not shown) of the ADC is used to set a fixed voltage which is applied to terminal 600 when terminal 51i is electrically floating in potential. This voltage applied to terminal 600 when terminal 51i is electrically floating in potential causes the potential of terminal 51i to change from ground potential to a level corresponding to the voltage level applied to terminal 600. Capacitor C1 is typically just one of a plurality of capacitors (not shown) which each have a first terminal connected to the terminal 51i and each have a second terminal coupled to a separate one of a plurality of comparators (not shown) of the ADC.

Figure 3:
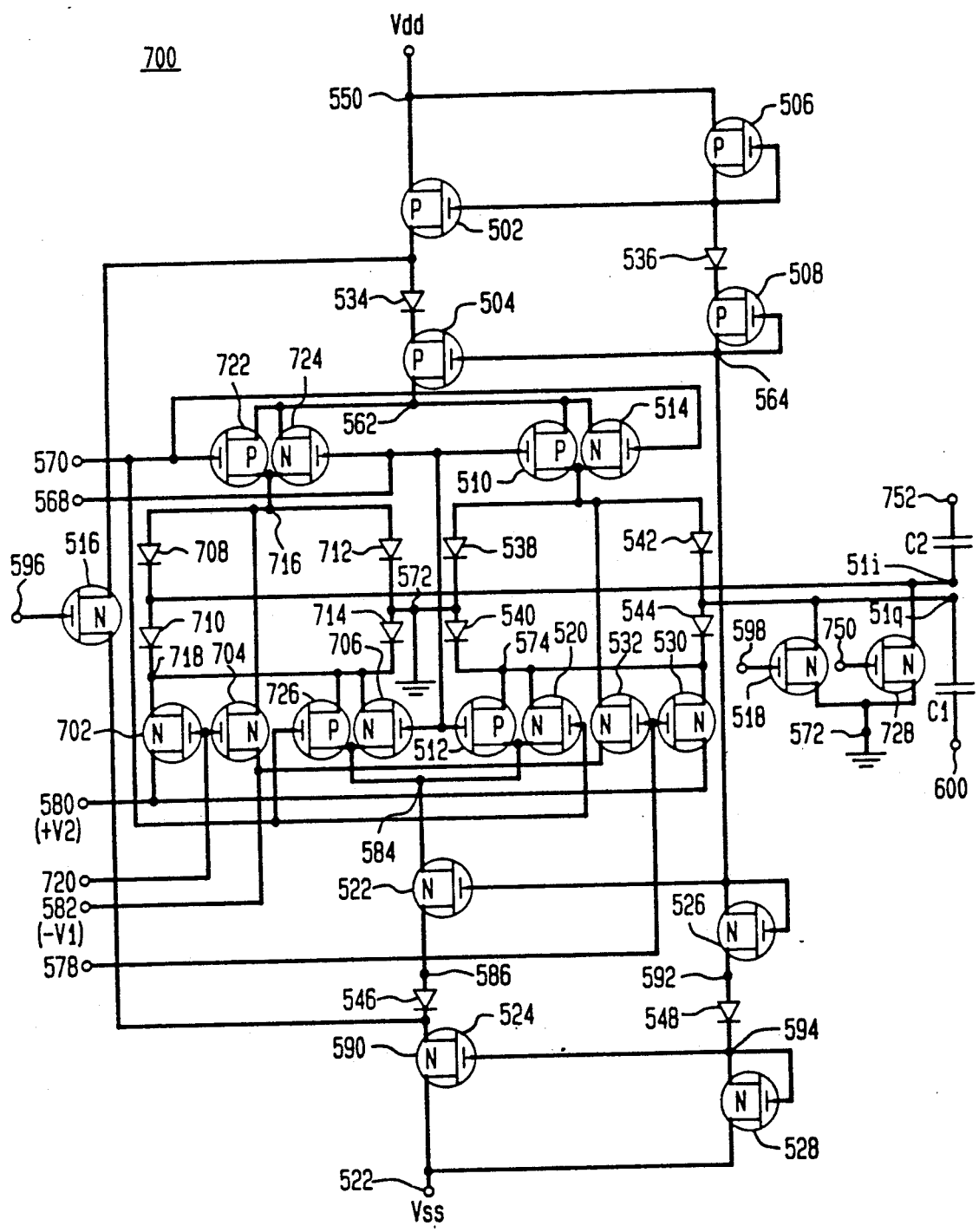
FIG. 3 shows dual ground break circuitry in accordance with another embodiment of the invention.

Referring now to FIG. 3, there is shown the switching circuitry 700 in accordance with another embodiment of the invention. Switching circuitry 700 has the same basic configuration as switching circuitry 500 of FIG. 2 and has the same components with the same reference numbers and configuration and in addition comprises n-channel transistors 702, 704, 706 and 724, p-channel transistors 722 and 726, and diodes 708, 710, 712 and 714 and a capacitor C2. In a preferred embodiment diodes 708, 710, 712 and 714 are Schottky barrier diodes. First terminals of C1 and C2 are coupled to output terminals 51i and 51q, respectively. Second terminals of C1 and C2 are coupled to terminals 600 and 752, respectively.

Circuitry 700 performs the same basic function as circuitry 500 of FIG. 2 in that it selectively causes output terminal 51i to be set to ground potential and held there and then it subsequently electrically isolates output terminal 51i from other components of circuitry 700 except for capacitor C1 which then floats in potential. In addition, circuitry 700 selectively causes the output terminal 51q to be set to ground potential and held there and then it subsequently electrically isolates output terminal 51q from all other components of circuitry 700 except for capacitor C2 which then floats in potential. During the time periods that output terminals 51i and 51q electrically float in potential, potentials applied to terminals 600 and 752 cause the potentials of terminals 51i and 51q, respectively, to be modified as a function of the applied voltages and then to float in potential at the newly established levels. Circuitry 700 is useful in a ADC in which C1 represents one capacitor of a plurality of capacitors of a first array of capacitors and C2 represents one capacitor of a plurality of capacitors of a second array of capacitors.

The drains of transistors 504, 514 and 724 are coupled to the source of transistors 510 and 722 and to the terminal 562. The gates of transistors 514, 520, 722 and 726 are coupled to the terminal 570. The gates of transistors 510, 512, 706 and 724 are coupled together to a terminal 568. The drain of transistor 722 is coupled to the source of transistor 724, to the anodes of diodes 708 and 712, to the drain of transistor 704 and to a terminal 716. The cathode of diode 708 is coupled to the anode of diode 710, to the drain of transistor 728, to a first terminal of capacitor C2 and to a third circuitry output terminal 51q. The gate of transistor 728 is coupled to a terminal 750. The sources of transistors 518 and 728, the cathodes of diodes 538 and 712 and the anode of diodes 540 and 714 are coupled to a terminal 572 which is coupled to ground. The cathodes of diodes 710 and 714 are coupled to the drains of transistors 702 and 706, to the source of transistor 726 and to a terminal 718. The drains of transistors 503 and 702 are coupled together to the terminal 580 and to a positive voltage source +V2. The sources of transistors 532 and 704 are coupled together to the terminal 582 and to a negative voltage source −V1. The gates of transistors 702 and 704 are coupled together to a terminal 720. The sources of transistors 520 and 706 are coupled to the drain of transistors 512, 522 and 726 and to a terminal 584.

Transistor 516 forms a first circuit leg; transistors 510 and 514, diodes 538, 540 542 and 544 and transistors 512 and 520 form a second leg circuit; and transistors 722 and 724, diodes 708, 710, 712 and 714 and transistors 706 and 726 form a third circuit leg. Diodes 534 and 546 and transistors 504 and 522 are common components of the second and third circuit legs.

Output terminals 51i and 51q both float in potential when transistor 516 is turned-on and transistors 510, 512, 514 and 520 are biased on or off and transistors 722, 724 and 726 are biased oppositely. In addition, transistors 530 and 532 are turned-on to reverse bias diodes 538, 540, 542 and 544 and transistors 702 and 704 are turned-on to reverse bias diodes 708, 710, 712 and 714. These conditions result in current flow through the first circuit leg (transistor 516) and capacitors C1 and C2 being electrically isolated from each other and from all other components of circuitry 700 and electrically floating in potentials which can be modified by potentials applied to terminals 600 and 752 of capacitors C1 and C2, respectively.

If it is now desired to set the potential of output terminal 51i to ground potential, transistors 516, 530 and 532 are turned-off and the transistors 706, 722, 724 and 726 are turned-off, transistors 702 and 704 are left turned-on and transistor 728 is turned on. This initially causes transistor 518 to rapidly turn on and pull output terminal 51i to ground potential and hold it there. It also results in current flow through the second circuit leg which sets the potential of output terminal 51i to ground potential and holds it there. Transistor 518 is turned off as soon as the second leg holds the output terminal 51i at ground potential. Transistor 518 serves essentially as a rapid pull up device to cause output terminal 51i to rapidly reach ground potential. Output terminal 51q floats in potential at this time and is modified in potential by any signal or voltage level applied to terminal 752. Transistor 518 is turned-on when current begins to flow through the second circuit leg in order to help quickly set the output terminal 51i to ground potential. It is turned-off before current is cut-off through the second circuit leg because its turn-off results in transients which vary the potential of output terminal 51i from ground potential. These transients are dissipated by subsequent current flow through the second circuit leg. Thus output terminal 51i reaches ground potential and then floats there after current is cutoff through the second circuit leg by the turning on of transistor 516.

If subsequently it is desired to set the potential of output terminal 51q to ground potential, transistors 706, 722, 724 and 726 are turned-on and transistors 510, 512, 514, 516 and 520 are turned-off. This results in current flow through the third circuit leg which sets the potential of output terminal 51q to ground and holds it there. Output terminal 51i floats in potential at this time and is modified in potential by a signal or voltage level applied to terminal 600. Transistor 728 is turned-on when current begins to flow through the third circuit leg and rapidly sets the output terminal 51q to ground potential. It is turned-off before current is cut-off through the third circuit leg because its turn-off results in transients which vary the potential of output terminal 51q from ground potential. These transients are dissipated by subsequent current flow through the third circuit leg. Thus output terminal 51q reaches ground potential and then floats in potential after current is cutoff through the third circuit leg.

Referring now to FIGS. 4, 5, 6, 7, 8, 9 and 10 there are graphically shown voltage waveforms applied to terminals 596, 568, 570, 720, 578, 598 and 750, respectively, of apparatus 700 of FIG. 3. FIGS. 11 and 12 graphically show the resulting voltage waveforms appearing on terminals 51*i* and 51*q*, respectively, of apparatus 700 of FIG. 3 when the voltage waveforms of FIGS. 4, 5, 6, 7, 8, 9 and 10 are used. In FIGS. 4, 5, 6, 7, 8, 9, 10, 11 and 12 the y-axis of each is voltage V (volts) and the x-axis is time T (nanoseconds).

With the voltage waveforms of FIGS. 4, 5, 6, 7, 8, 9 and 10 applied to terminals 596, 568, 570, 720, 578, 598 and 750, respectively, the output terminal 51*i* is set to and actively held at ground potential during the time periods T=t0 to t2, T=t8 to t10 and T=t16 to t18 and electrically floats in potential during the time periods T=t2+ to t8− and T=t10+ to t16−. With the same applied waveforms, output terminal 51*q* is set to and actively held at ground potential during the time periods T=t4 to t6 and T=t12 to t14 and electrically floats in potential during the time periods T=t0 to t4−, T=t6= to t12− and T=t14+ to t18−. The frequency of the waveform of FIG. 4 is essentially twice that of the frequency of each of the waveforms of FIGS. 5, 6, 7 and 8. The transitions of the waveforms of FIGS. 5 and 6 are shown to be sloped (not vertical). This decreases injected charge due to parasitic capacitance (not shown) between the gates of transistors 510, 512, 514, 520, 702, 704, 722 and 724 and their respective drains and sources. The problem of injected charge in a transmission gate is described herein below.

The embodiments of FIG. s 1, 2 and 3 and the graphs of FIGS. 4, 5, 6, 7, 8, 9, 10, 11 and 12 are shown and described in a copending patent application, Ser. No. 356,084, now U.S. Pat. No. 5,014,055, which is being filed concurrently with this patent application and in which there is a common assignee and one common inventor.

MOS transistor 22 of FIG. 1 and MOS transistor 516 of FIGS. 2, and 3 act essentially as transmission gates which allow communication through a path comprising the drain-source thereof with a control signal applied to the gate electrode serving to switch this path between a high (when the transistor is turned off) and a low (when the transistor is turned on) impedance state.

However, it is a characteristic of a MOS transistor that it has a first parasitic capacitor between the gate and source and a second parasitic capacitor between the and gate and drain that serve to shunt signal charge both when the transistor is being turned on and again when it is being turned off. Such capacitive shunting serves to slow the onset of the high impedance state when the transistor is turned off and the onset of the low impedance state when the transistor is turned on. Additionally, charge injected by a control pulse applied to the gate of the transistor can be trapped in the channel of the transistor, a phenomenon known as charge pumping. At high switching speeds this trapped change can lead to significant errors. To minimize this charge pumping, the usual practice is to associate the transistor with a pair of dummy transistors used as two terminal capacitors in the manner shown in FIG. 4. Still further, the charge injected can change the voltage levels of signals being transmitted through the transmission gate and can thus destroy these signals. These problems are particularly of interest in some analog-to-digital converters which require high accuracy input signals.

Figure 13:
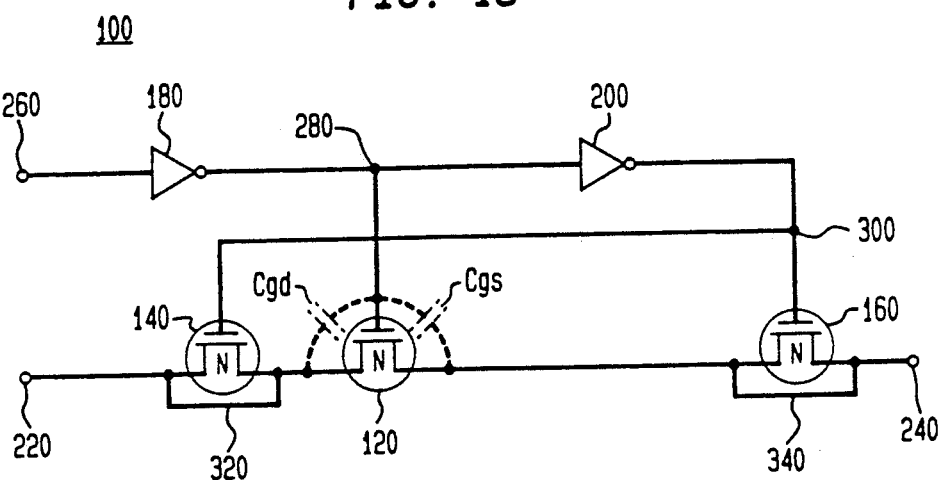
FIG. 13 shows a known transmission gate which can be substituted for a transistor in each of the circuits shown in FIGS. 1, 2 and 3.

Referring now to FIG. 13, there is shown a transmission gate 100 which includes n-channel MOS transistors 120, 140 and 160 and first and second inverters 180 and 200. Inverter 180 is used as a buffer and is optional. Transmission gate 100 controls a transmission path from a terminal 220, which is coupled to the drain and source of transistor 140 and to the drain of transistor 120, to a terminal 240 which is coupled to the drain and source of transistor 160 and to the source of transistor 120.

An output terminal of an n-channel transistor is generally denoted as the drain if positive current flows into same and passes through the channel of the transistor and exits at the other output terminal which is denoted as the source. If the direction of current flow through the transistor reverses, the drain and source designations of the output terminals reverse.

A control signal input terminal 260 is coupled to an input of inverter 200. An output of inverter 180 is coupled to an input of inverter 200, to the gate of transistor 120 and to a terminal 280. An output of inverter 200 is coupled to the gates of transistors 140 and 160 and to a terminal 300. A first conductor 320 shorts the drain and source of transistor 140 together and a second conductor 340 shorts the drain and source of transistor 160 together. Transistors 140 and 160, with their drains and sources shorted together, act as capacitors and as such may be denoted as capacitors 140 and 160 with the gate of each serving as a first capacitor terminal and the source and drain of each serving as a second capacitor terminal. Capacitors Cgs and Cgd, shown in dashed lines, are the parasitic gate to source capacitance and gate to drain capacitance of transistor 120. Cgs and Cgd are typically equal because of the symmetrical structure of the typical MOS transistor.

The dimensions of transistors 140 and 160 are typically selected to be identical to those of transistor 120 except that the channel width of each is one-half of that of the channel width of transistor 120. This to a large order makes the capacitance of each of transistors 140 and 160 equal to Cgs and Cgd, respectively.

During operation a control voltage pulse (not shown in FIG. 4) is applied to terminal 260 and same is inverted by inverter 180 and then by inverter 200. This voltage pulse serves to turn on and turn off transistor 120. In doing so charge is injected via Cgs and Cgd to terminals 220 and 240, respectively. This injected charge can change the potential of terminals 220 and 240 which can in some applications modify and/or alter information being transmitted through transmission gate 100. It also can increase the transition time needed to switch to the high impedance state of transmission gate 100.

In operation, the capacitors 140 and 160 are designed to provide charge compensation to the transistor 120 for capacitive coupled current flowing therein by supplying or withdrawing and appropriate equal amount of capacitive coupled charge to terminals 220 and 240, respectively.

Transmission gate 100 can be substituted for transistor 22 of FIG. 1 and for transistor 516 of FIGS. 2 and 3.

It is to be appreciated that the specific embodiments described are merely illustrative of the general principals of the invention. Various modifications may be provided consistent with the principles set forth. For example, many different current sources can be substituted for the current sources of FIGS. 1, 2 and 3. Still further, the reverse biasing transistors can be replaced by a variety of different circuitry which each perform the same function. Still further, the transmission gates of FIGS. 2 and 3 could each be replaced by two of the transmission gates of FIG. 13 with one of the substituted transmission gates using p-channel transistors and the other using n-channel transistors. Still further, the transmission gate 100 of FIG. 13 can be substituted for the transistor 518 of FIGS. 2 and 3 and for the transistor 728 of FIG. 3. Still further, n-channel transistor 24 of circuitry 10 of FIG. 1 could be replaced by a p-channel transistor with appropriate gate potentials used to turn on transistor 24. This allows the full potential level of +V to reach terminal 54. The use of the n-channel transistor results in only +V minus the threshold voltage of the transistor to reach terminal 54. Correspondingly, n-channel transistors 530 of circuitry 500 of FIG. 2 and n-channel transistors 702 and 530 of circuitry 700 of FIGS. 2 and 3, respectively, could be replaced by separate p-channel transistors provided the gates of these transistors are separate from the gates of any n-channel transistors they are shown coupled to. Still further, the circuitry 700 can be expanded by adding one or more additional circuit legs which are essentially identical to the second or third circuit leg. Current would still be allowed to flow through essentially only one circuit leg at a time. Still further, in some applications the transmission gates (transistors 510 and 514 and transistors 512 and 520 of FIG. 2 and transistors 510 and 514, transistors 512 and 520, transistors 722 and 724 and transistors 706 and 726 of FIG. 3 can be eliminated. Still further, in some applications transistor 518 of FIG. 2 and transistors 518 and 728 of FIG. 3 can be eliminated.

What is claimed is:

1. Circuitry comprising:
   first and second power terminals for the application therebetween of an operating potential;
   storage means coupled to a circuitry output terminal for storing information appearing at the circuitry output terminal for a useful period of time;
   a circuit leg comprising first, second, third and fourth diodes configured as a Wheatstone bridge with the cathode of the first diode and the anode of the second diode being coupled to a circuitry input terminal and with the circuitry output terminal being coupled to the cathode of the third diode and to the anode of the fourth diode;
   the anodes of the first and third diodes being coupled together at a first node;
   the cathodes of the third and fourth diodes being coupled together at a second node; and
   control means coupled to the circuit leg for controlling current flow through the diodes such that selectively current can be diverted away from the diodes, said control means comprising first, second, third and fourth transistors, each transistor having first and second electrodes defining the ends of a conduction path, and a control electrode for controlling the conductivity of the transistor;
   means coupling the conduction paths of said first and second transistors in series between said first node and said first power terminal; and
   means coupling the conduction paths of said third and fourth transistors in series between said second node and said second power terminal.

2. Circuitry comprising:
   first and second circuit legs;
   a current source coupled to the first and second circuit
   storage means coupled to a circuitry output terminal for storing information appearing at the output terminal for a useful period of time;
   the first circuit leg comprises first, second, third and fourth diodes configured as a Wheatstone bridge with the cathode of the first diode and the anode of the second diode being coupled to a circuitry input terminal and with the circuitry output terminal being coupled to the cathode of the third diode and to the anode of the fourth diode;
   the anodes of the first and third diodes being coupled together at a first node;
   the cathodes of the third and fourth diodes being coupled together at a second node;
   control means for controlling current flow through the first and second circuit legs such that current can essentially flow through one circuit leg or the other circuit leg; and
   wherein said second circuit leg comprises a first MOS transistor having first and second output terminals and a gate terminal; and
   wherein the control means comprises means for selectively reverse biasing the diodes and for selectively biasing on the first MOS transistor and for selectively biasing off the first MOS transistor; and
   wherein the means for reverse biasing the diodes comprises second and third MOS transistors each having first and second output terminals and a gate terminal with the first output terminal of the second transistor being coupled to the anodes of the first and third diodes and with the first output terminal of the second MOS transistor being coupled to the cathodes of the second and fourth diodes.

3. The circuitry of claim 2 wherein the diodes are Schottky barrier diodes.

4. The circuit of claim 3 wherein the storage means is a capacitor.

5. The circuitry of claim 2 wherein:
   the first circuit leg further comprises fourth and fifth MOS transistors each having a gate terminal and first and second output terminals;
   the first output terminal of the fourth transistor being coupled the anodes of the first and third diodes, and the first output terminal of the fifth transistor being coupled to the cathodes of the second and fourth diodes; and
   the second output terminal of the fourth transistor being coupled to a first portion of the current source, and the second output terminal of the fifth transistor being coupled to a second portion of the current source.

6. The circuitry of claim 5 wherein the first circuit leg further comprises a fifth diode whose anode is coupled to the first portion of the current source and whose cathode is coupled to the second output terminal of the fourth transistor, and a sixth diode whose anode is coupled to the second output terminal of the fifth transistor and whose cathode is coupled to the second portion of the current source.

7. The circuitry of claim 6 wherein:
   the current source comprises sixth and seventh MOS transistors each having first and second output terminals and a gate terminal;
   the first output terminal of the sixth transistor being coupled to the anode of the fifth diode; and
   the first output terminal of the seventh transistor being coupled to the cathode of the sixth diode.

8. The circuitry of claim 7 wherein the fourth and sixth transistors are of the same conductivity type and the fifth and seventh transistors are of the same conductivity type.

9. The circuitry of claim 8 wherein:
the current source is an essentially constant current source and further comprises eighth, ninth, tenth and eleventh MOS transistors each having first and second output terminals and a gate terminal, and seventh and eighth diodes;
the first output terminals of the sixth and eighth transistors being coupled together;
the second output terminal and the gate terminal of the eighth transistor being coupled to the gate terminal of the sixth transistor and to an anode of the seventh diode;
a cathode of the seventh diode being coupled to the first output terminal of the ninth transistor;
the gate terminal and the second output terminal of the ninth transistor being coupled to gate terminals of the fourth, fifth and tenth transistors and to the first output terminal of the tenth transistor;
the eighth and ninth transistors being of the same conductivity type as the fourth and sixth transistors;
the second output terminal of the tenth transistor being coupled to an anode of the eighth diode, to the gate terminals of the seventh and eleventh transistors and to the first output terminal of the eleventh transistor;
the second output terminals of the seventh and eleventh transistors being coupled together; and
the tenth and eleventh transistors being of the same conductivity type as the fifth and seventh transistors.

10. The circuitry of claim 9 wherein:
the fifth, sixth, seventh and eighth diodes are Schottky barrier diodes; and
the fourth, sixth, eighth and ninth transistors are of one conductivity type and the fifth, seventh, tenth and eleventh transistors are of the opposite conductivity type.

11. The circuitry of claim 10 wherein the first, second and third transistors are of the same conductivity type.

12. The circuitry of claim 14 wherein the first transistor is of n-type conductivity and the fourth transistor is of p-type conductivity.

13. The circuitry of claim 10 wherein the first, third and fifth transistors are of n-type conductivity and the second and fourth transistors are of p-type conductivity.

14. Circuitry comprising:
first and second circuit legs;
a current source coupled to the first and second circuit legs;
the first circuit leg comprises first, second, third and fourth diodes configured as a Wheatstone bridge and capacitive means with a circuitry input terminal coupled to the cathode of the first diode and to the anode of the second diode and with a circuitry output terminal coupled to the cathode of the third diode, to the anode of the fourth diode and to a first terminal of the capacitive means;
the anodes of the first and third diodes being coupled together;
the cathodes of the third and fourth diodes being coupled together;
first means comprising MOS transistors coupled to the diodes for selectively reverse biasing the diodes to cut off current flow therethrough; and
second means coupled to the second leg for selectively controlling current flow there through;
the first and second means being adapted such that current can essentially only flow through one circuit leg or the other circuit leg.

15. The circuitry of claim 13 wherein the diodes are Schottky barrier diodes.

16. The circuit of claim 15 wherein the capacitive means is at least one capacitor.

17. The circuit of claim 16 wherein the current source is an essentially constant current source which is comprised of MOS transistors.

18. The circuit of claim 17 wherein the constant current means further comprises Schottky barrier diodes.

19. The circuit of claim 18 wherein the current source further comprises a voltage biasing circuit which is comprised of MOS transistors.

20. The circuit of claim 19 wherein the voltage biasing circuit further comprises a resistor.

21. A track/hold circuit comprising:
first and second circuit legs;
an essentially constant current source coupled to the first and second circuit legs;
the first circuit leg comprises first, second, third and fourth diodes configured as a Wheatstone bridge;
a track/hold circuit input terminal being coupled to the cathode of the first diode and to the anode of the second diode;
a track/hold circuit output terminal being coupled to the cathode of the third diode, to the anode of the fourth diode and to a first terminal of a capacitor;
the anodes of the first and third diodes being coupled together at a first node and said first node being coupled via the conduction path of a first transistor to a first portion of the current source;
the cathodes of the third and fourth diodes being coupled together at a second node and said second node being coupled via the conduction path of a second transistor to a second portion of the current source;
first means coupled to the diodes for selectively reverse biasing the diodes to cut off current flow therethrough; and
second means coupled to the second leg for selectively controlling current flow therethrough; and
the first and second means being adapted such that current can essentially only flow through one circuit leg or the other circuit leg.

22. Circuitry comprising:
first, second and third circuit legs;
a current source coupled to the first, second and third circuit legs;
first storage means coupled to a first circuitry output terminal for storing information appearing at the first circuitry output terminal for a useful period of time;
second storage means coupled to a second circuitry output terminal for storing information appearing at the second circuitry output terminal for a useful period of time;
the first circuit leg comprises first, second, third and fourth diodes configured as a Wheatstone bridge with the cathode of the first diode and the anode of the second diode being coupled to a first circuitry input terminal and with the first circuitry output terminal being coupled to the cathode of the third diode and to the anode of the fourth diode;
the anodes of the first and third diode being coupled together;

the cathodes of the third and fourth diodes being coupled together;

the second circuit leg comprises fifth, sixth, seventh and eighth diodes configured as a Wheatstone bridge with the cathode of the fifth diode and the anode of the sixth diode being coupled to a second circuitry input terminal and with the second circuitry output terminal being coupled to the cathode of the seventh diode and to the anode of the eighth diode;

the anodes of the fifth and seventh diodes being coupled together;

the cathodes of the sixth and eighth diodes being coupled together; and control means for controlling current flow through the first, second and third circuit legs such that current can flow essentially through only one selected circuit leg at a time.

23. The circuitry of claim 22 wherein:

the first circuit leg comprises a first transmission gate having a first terminal coupled to the anodes of the first and third diodes and further comprises a second transmission gate having a first terminal coupled to the cathodes of the second and fourth diodes; and the second circuit leg comprises a third transmission gate having a first terminal coupled to the anodes of the fifth and seventh diodes and further comprises a fourth transmission gate having a first terminal coupled to the cathodes of the sixth and eighth diodes.

24. The circuitry of claim 23 wherein:

the third circuit leg comprises a first MOS transistor having first and second output terminals and a gate terminal; and all of the diodes are Schottky barrier diodes.

25. The circuitry of claim 24 further comprising:

second and third MOS transistors each having first and second output terminals and a gate terminal;

second terminals of the first and second transmission gates being coupled to the first output terminal of the second transistor;

second terminals of the third and fourth transmission gates being coupled to the first output terminal of the third transistor;

ninth and tenth diodes;

the cathode of the ninth diode being coupled to the second output terminal of the second transistor; and the anode of the tenth diode being coupled to the second output terminal of th third transistor.

26. The circuitry of claim 25 wherein the ninth and tenth diodes are Schottky barrier diodes.

27. The circuitry of claim 26 wherein:

the current source is an essentially constant current source which comprises fourth and fifth MOS transistors each having first and second output terminals and a gate terminal;

the first output terminal of the fourth transistor being coupled to the anode of the ninth diode and to the first output terminal of the first transistor; and the first output terminal of the fifth transistor being coupled to the second output terminal of the first transistor and to the cathode of the tenth diode.

28. The circuitry of claim 26 wherein:

the constant current source further comprises sixth and seventh MOS transistors, which are of the same conductivity type as the second and fourth transistors, eighth and ninth MOS transistors, which are of the same conductivity type as the third and fifth transistors, eleventh and twelfth Schottky barrier diodes;

the sixth, seventh, eighth and ninth transistors each having first and second output terminals and a gate terminal;

the first output terminals of the fourth and sixth transistors being coupled together;

the gate terminals of the fourth and sixth transistors being coupled to the second output terminal of the sixth transistor and to the anode of the eleventh diode;

the cathode of the eleventh diode being coupled to the first output terminal of the seventh transistor;

the second output terminal and the gate terminal of the seventh transistor being coupled to the gate terminal and the first output terminal of the eighth transistor and to the gate terminals of the second and third transistors;

the second output terminal of the eighth transistor being coupled to the gate terminals of the fifth and ninth transistors and to the first output terminal of the ninth transistor; and the second output terminals of the fifth and ninth transistors being coupled together.

29. The circuitry of claim 28 wherein each of the transmission gates comprises a complementary pair of MOS transistors with first output terminals of both transistors being coupled together and being coupled to a first terminal of each transmission gate and with second output terminals of both transistors being coupled together and being coupled to a second terminal of each transmission gate.

* * * * *